United States Patent [19]

Johnston, Jr. et al.

[11] Patent Number: 4,935,382
[45] Date of Patent: Jun. 19, 1990

[54] METHOD OF MAKING A SEMICONDUCTOR-INSULATOR-SEMICONDUCTOR STRUCTURE

[75] Inventors: Wilbur D. Johnston, Jr., Mendham; Charles W. Tu, Basking Ridge, both of N.J.

[73] Assignee: American Telephone and Telegraph Company, New York, N.Y.

[21] Appl. No.: 265,175

[22] Filed: Oct. 31, 1988

Related U.S. Application Data

[60] Division of Ser. No. 115,230, Oct. 30, 1987, abandoned, which is a continuation of Ser. No. 628,151, Jul. 5, 1984, abandoned.

[51] Int. Cl.$^5$ ............................................. H01L 21/20
[52] U.S. Cl. ............................ 437/81; 148/DIG. 56; 148/DIG. 72; 148/DIG. 97; 156/612; 437/84; 437/126; 437/107; 437/939; 437/976
[58] Field of Search ................ 148/DIG. 24, 48, 56, 148/65, 72, 95, 97, 110, 160, 169; 156/610–615; 427/248.1, 255.1; 437/81, 84, 110, 111, 126, 129, 105, 107, 936, 939, 946, 976

[56] References Cited

U.S. PATENT DOCUMENTS

| | | | |
|---|---|---|---|
| 3,915,765 | 10/1975 | Cho et al. | 437/946 |
| 4,555,301 | 11/1985 | Gibson et al. | 156/617 R |
| 4,792,832 | 12/1988 | Baba et al. | 437/110 |

OTHER PUBLICATIONS

Sikos et al., "GaAs/(Ca,Sr)F$_2$/(001)GaAs Lattice-Matched Structures Grown by Molecular Beam Epitaxy", Appl. Phys. Lett., 44(12), Jun. 15, 1984, pp. 1146–1148.
Tu et al., "Epitaxial InP/Fluoride/InP (001) Double Heterostructures Grown by Molecular Beam Epitaxy", Appl. Phys. Lett., 43(6), Sep. 15, 1983, pp. 569–571.
Siskas et al., "Epitaxial Growth of Lattice-Matched Ca$_x$Sr$_{1-x}$F$_2$on (100) and (110) GaAs Substrates", J. Appl. Phys., 56(6), Sep. 15, 1989, pp. 1642–1646.

Primary Examiner—Brian E. Hearn
Assistant Examiner—William Bunch
Attorney, Agent, or Firm—W. G. Nilsen

[57] ABSTRACT

A semiconductor epitaxial device structure is described in which there are alternate single crystal layers of semiconductor, insulator and semiconductor. A typical example is InP/CaF$_2$/InP. A process for producing such a structure is also described.

19 Claims, 2 Drawing Sheets

METHOD OF MAKING A SEMICONDUCTOR-INSULATOR-SEMICONDUCTOR STRUCTURE

This is a division of application Ser. No. 115,230 filed Oct. 30, 1987, now abandoned which is a continuation of application Ser. No. 628,151 filed July 5, 1984, now abandoned.

TECHNICAL FIELD

The invention involves a novel semiconductor device structure and procedures for producing such devices.

BACKGROUND OF THE INVENTION

The rapid development of semiconductor technology both in terms of unique and different devices and in higher packing density has led to unique requirements for materials and device structures. Typical examples are the use of better passivating materials, better insulating materials, unique optical materials, etc.

A particularly interesting type of structure is that involving alternating layers of single-crystal insulator and semiconductor. Such a structure has a number of potentially interesting characteristics associated with the single crystal nature of the various layers including tunneling between layers, low trap density, etc.

In many semiconductor structures, minimization of the number of defect states (the trap density) in the interface between two different materials (e.g., between semiconductor and insulator in a metal-insulator-semiconductor structure) is highly desirable. This leads to much better device performance. To minimize trap density, it is desirable to have not only a single crystal layer of insulator lattice matched to the semiconductor but also a crystal structure closely compatible to the semiconductor. In this way, the discontinuity at the insulator-semiconductor interface is minimized so the trap density is minimized.

A number of references have been concerned with epitaxial dielectric layers on various semiconductor surfaces. Particularly interesting are two articles, the first entitled, "Insulating Epitaxial Films of $BaF_2$, $CaF_2$ and $Ba_xCa_{1-x}F_2$ Grown by MBE on InP Substrates" by P. W. Sullivan et al, *Journal of Crystal Growth*, pages 403-413 (1982) and a second entitled, "MBE-Grown Fluoride Films: A New Class of Epitaxial Dielectrics" by R. F. C. Farrow et al, *Journal of Vacuum Science and Technology*, 19(3), pages 415-420 (September-October 1981). Also of interest is an abstract by C. Fontaine, S. Siskos and A. Munoz-Munoz entitled, "Epitaxial Growth of Lattice Matched Group II Fluorides on GaAs Substrates" appearing in the abstracts for the *Second European Workshop on Molecular Beam Epitaxy*, Sussex University, Brighton (Mar. 27-30, 1983).

SUMMARY OF THE INVENTION

The invention involves semiconductor devices with unique structural features and processes for fabricating such semiconductor devices. The semiconductor involved in the invention are InP and GaAs and various related semiconductor compounds (e.g., which can be lattice matched to GaAs or InP) such as InGaAs, InGaAsP, InGaAlAs and AlInAs. The invention applies to various kinds of doping including n-type, p-type, undoped, compensated, etc. The invention is a semiconductor device comprising one or more sandwich structures with a single-crystal fluoride layer between a single-crystal semiconductor. A typical structure involves semiconductor substrate followed by an epitaxial single-crystal layer of insulator and an epitaxial single-crystal layer of semiconductor. A III-V semiconductor compound is used as the semiconductor and an inorganic fluoride as the insulating compound. Additional layers may be used to build up a structure consisting of alternate layers of semiconductor and insulator. Generally, the number of layers should not exceed 1000. Typical structures are $InP/CaF_2/InP(001)$ and $InP/Ba_xSr_{1-x}F_2/InP(001)$. The layers are grown by molecular beam epitaxy using highly specialized parameters such as substrate temperature, deposition rate, etc. Epitaxial semiconductor-dielectric-semiconductor double heterostructures have a number of interesting device applications including electronic devices and photonic devices since they offer possibilities of device isolation, waveguiding, and three-dimensional integrated circuits.

DETAILED DESCRIPTION

Figure 1:
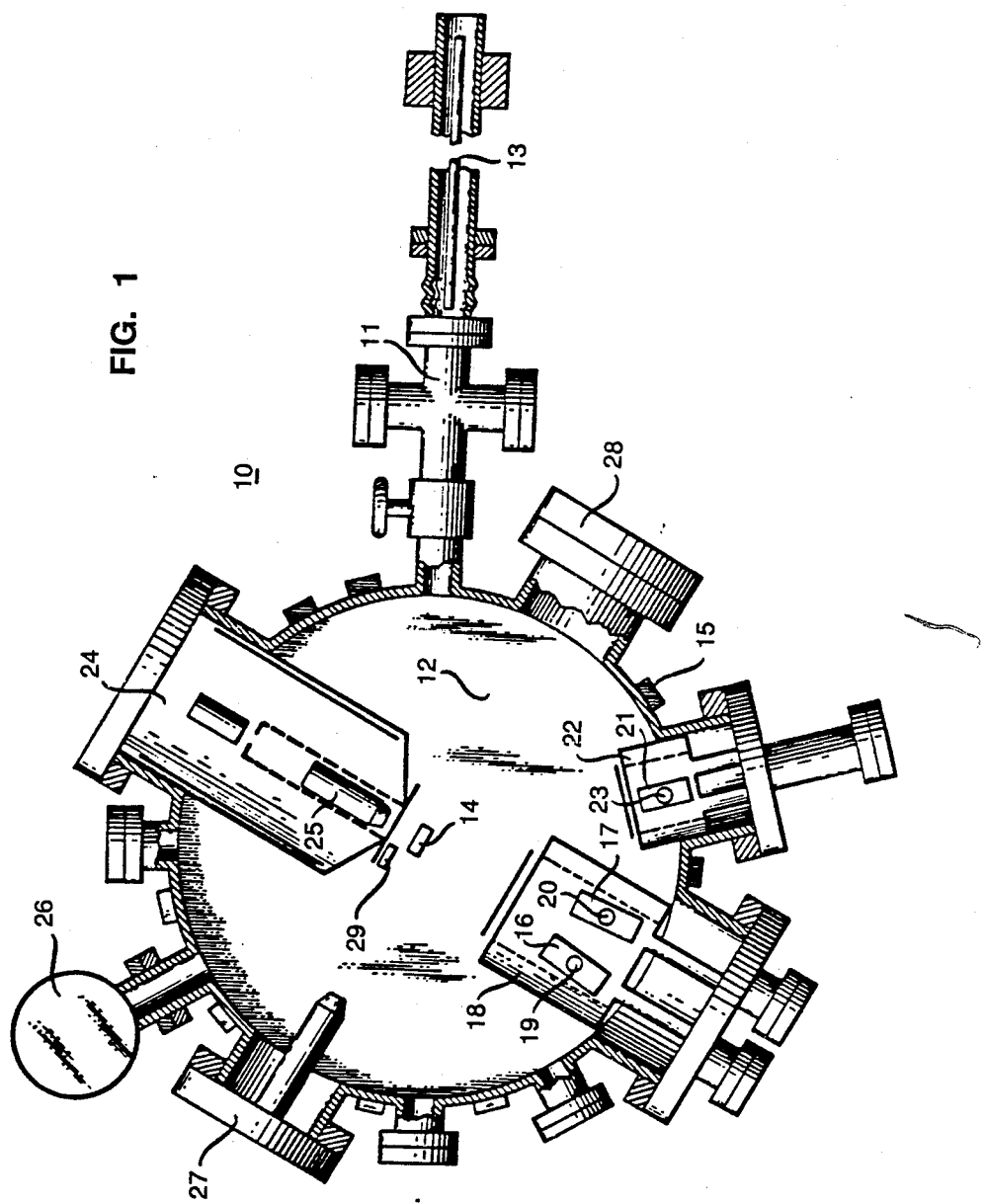
FIG. 1 shows a schematic of a molecular beam epitaxial apparatus useful in the practice of the invention.

The invention involves certain device structures and processes for making these device structures. The device structure involves alternate layers of III-V semiconductor and fluoride insulator. The simplest device structure comprises a substrate made of a III-V compound semiconductor (e.g., InP, GaAs, etc.) which is at least partially covered with an epitaxial layer of crystalline dielectric and this layer at least partially covered with an epitaxial layer of III-V compound semiconductor. More complex structures involve further alternate epitaxial, single-crystal layers of dielectric and III-V semiconductor compound. The crystalline dielectric layer is made of an inorganic fluoride such as calcium fluoride or barium-strontium fluoride. A typical structure has an InP substrate covered with an epitaxial layer of calcium fluoride and then an epitaxial layer of InP.

Included in the invention are Group III-V semiconductor compounds which have lattice constants close to the Group II cubic fluoride or their solid solutions. Lattice constants for the fluorides of interest in Angstroms are $BaF_2$—6.2001; $CaF_2$—5.4640; and $SrF_2$—5.7996. For the solid solution system $Ca_xSr_{1-x}F_2$, the lattice parameters range from 5.4640 to 5.7996 and for the solid solution system $Ba_xSr_{1-x}F_2$, the lattice parameter varies from 7.996 to 6.2001 Angstrom units.

Also included in the invention are various substrates (including substrates of III-V compounds) with one or more epitaxial layers of III-V semiconductor compound or semiconductor compounds with crystalline layer of cubic fluoride on top of the epitaxial layer of III-V compound semiconductor. An exemplary structure is an InP substrate covered with a thin layer of lattice matched GaInAs (e.g., $Ga_{0.47}In_{0.53}As$).

An important aspect of the invention is that the fluoride film and the semiconductor film are single crystal and can be, but do not necessarily have to be, lattice matched to the adjacent layer. For the (001) surface of InP, both $SrF_2$ and $CaF_2$ yield substantially twin-free single crystal films. In addition, $Ba_xSr_{1-x}F_2$ yields substantially twin-free single crystalline films. Also, by appropriate adjustment of composition x, this solid solution system can be lattice matched to InP or any other III-V compound with lattice constant within the $Ba_xSr_{1-x}F_2$ system (roughly ranging from 5.7996 to 6.2001 Angstrom units). At room temperature, the value of x required to lattice match the insulating layer of InP is approximately 0.17. The epitaxial semiconductor layer on top of the insulating layer is also single crystal, essentially free of twinning. Generally, this epitaxial layer is InP but other III-V semiconductor compounds with approximately the same lattice parameters may be used.

For GaAs, twin-free single crystal epitaxial layers are obtained with $CaF_2$, $SrF_2$ as well as mixed crystals of $Ca_xSr_{1-x}F_2$. By appropriate adjustment of the composition of $Ca_xSr_{1-x}F_2$, this mixed fluoride system can be lattice matched to GaAs or any III-V semiconductor compound with lattice parameters in the range between $CaF_2$ and $SrF_2$ (5.4640-5.7996 Angstroms). Generally, the same semiconductor is used in the epitaxial layer above the insulating layer as is used for the semiconductor substrate. However, it should be recognized that other III-V semiconductors may be used (e.g., ternary and quaternary III-V semiconductor compounds) provided the lattice parameter is close to the lattice parameter of the insulating layer. For example, various III-V semiconductor compounds can be lattice matched to InP including $Al_xIn_{1-x}As$ with x equal to approximately 0.48; $Ga_xIn_{1-x}As$ with x equal to approximately 0.47 and $Ga_xIn_{1-x}As_yP_{1-y}$ with x varying from 0.26 to 0.40 and y varying from 0.60 to 0.91.

A list of ternary and quaternary III-V compound semiconductors that can be lattice matched to InP or GaAs is given in a book by H. C. Casey, Jr. and M. B. Panish entitled, *Heterostructure Lasers: Part B-Materials and Operating Characteristics*, Academic Press, New York (1978), Chapter 5. For example, a variety of ternary and quaternary systems can be lattice matched to GaAs including AlGaAs (throughout its composition range), $Ga_xIn_{1-x}P$ and $Al_xIn_{1-x}P$ with x equal to approximately 0.51, and $Al_xIn_{1-x}P_yAs_{1-y}$.

The value of x necessary to lattice match the mixed fluoride to the III-V semiconductor compound is easily determined since Vegard's law is obeyed (the lattice constant of the mixed fluoride is a linear function of composition).

A molecular beam epitaxial procedure is used structure. Here, the surface preparation procedure for the semiconductor surface and the temperature of the semiconductor substrate are particularly important.

Although various conventional molecular beam epitaxial apparatus (MBE apparatus) may be used, it is useful in understanding the invention to describe the apparatus used. The apparatus has been described by C. W. Tu et al, *Journal of the Electrochemical Society*, 130, 2081 (1983). A schematic of the MBE apparatus is shown in FIG. 1. The MBE system consists of a loadlock 11 and an 18-inch diameter growth chamber 12. The loadlock has a magnetically coupled transfer rod 13 for withdrawal of the sample 14 and is pumped with an 8 liter/second ion pump (not shown). The main chamber is pumped by a 500 liter/second ion pump (not shown). An insert tube 15 is shown for admitting chilled water to cool the main chamber. Also shown are two Knudsen cells 16 and 17 surrounded by a liquid nitrogen shroud 18 and containing pieces of crystalline fluoride 19 and indium 20. A third single cell 21 is also shown with liquid nitrogen shroud 22. This cell contains undoped polycrystalline InP 23 and is used as phosphorus source and the source of InP. Base pressures in the mid $10^{-11}$ Torr range can be obtained in the chamber with this system but normally between runs, the base pressure is maintained in the low $10^{-10}$ Torr range. During film growth, the pressure is typically about $2-5 \times 10^{-9}$ Torr. The MBE chamber contains a cylindrical-mirror analyzer 24 with an integral electron gun 25 for Auger analysis; a residual-gas analyzer 26 for monitoring background gas composition and phosphorus overpressure during substrate cleaning; a 5 keV reflection high energy electron diffraction (RHEED) gun 27, a phosphorus screen 28 and a thin-film quartz monitor 29 for thickness monitoring. The film thickness and refractive index were measured with an ellipsometer. Various other MBE apparatus may be used.

Certain features of the MBE procedure should be adhered to so as to reliably produce single crystal fluoride films. First, a cleaning procedure must be carried out so as to yield an oxide-free surface that is stoichiometric. This is done by heating the semiconducting material to a high enough temperature (usually 400-700 degrees C.) in the MBE apparatus under vacuum to remove the oxide coating while using the molecular beam to maintain the stoichiometry of the surface. This may be accomplished by maintaining a molecular beam of the more volatile component, conveniently done by heating the same III-V compound in the source cell. For InP, the substrate is exposed to a phosphorus beam while heating the substrate to a temperature range between 400-600 degrees C. with pressure less than $10^{-4}$ Torr. Preferred pressure is less than $10^{-5}$ Torr (e.g., $10^{-5}$-$10^{-6}$ Torr) and preferred temperature is $500 \pm 50$ degrees C. Generally, a cleaning procedure is not needed to deposit semiconductor on top of the dielectric layer because the surface of the dielectric layer is not exposed to outside air. Where needed, simple heating under vacuum should be sufficient.

A typical cleaning procedure for the semiconductor substrate is described in detail. The experiments were carried out on sulfur-doped (approximate doping level of $8 \times 10^{18}$ cm$^{-3}$) n-type InP substrates. The (001) face was used but the invention is applicable to any crystalline orientation. The substrate was polished using a chemical polishing solution (e.g., bromine-methanol) to remove most of the oxide coating and any other surface impurities. The final polishing was carried out with a one percent solution of bromine in methanol. The sample was then rinsed with methanol and spun dry. The quality of the polish was checked by the amount of scattering of a laser beam on the polished surface of the substrate. Various measurements using Auger signals for carbon and oxygen and RHEED patterns indicated that some oxide films remained on the surface.

The final cleaning procedure involved heating the substrate in an MBE apparatus under a molecular beam of phosphorus. The substrate was heated to about $500 \pm 50$ degrees C. under a phosphorus beam from a Knudsen cell containing InP pieces. The total pressure in the chamber, as determined by an ion gauge, was greater than about $3 \times 10^{-6}$ Torr during exposure. Exposure times between 2 minutes and 3 hours were sufficient to remove surface contaminants with 10 minutes the normally preferred time. The gas composition during exposure was monitored by a residual gas analyzer which showed mostly phosphorus. Various measurements on the surface of the InP showed that this procedure yielded a contamination-free surface which was stoichiometric. For GaAs, an arsenic beam is used often from a molecular beam oven containing elementary arsenic (As$_4$). The substrate temperature is typically 600±50 degrees C.

The fluoride films are put down by more or less conventional MBE procedures. To obtain single crystal films, particular attention is paid to substrate temperature and growth rate. In general, the temperature of the III-V semiconductor compound should be within the 150 degrees C. range below the decomposition temperature of the III-V semiconductor compound. The slowest rate of deposition which still yields single crystal is about 20 Angstroms per hour. For example, with InP, films may be grown with substrate temperatures between 250 and 350 degrees C. because of the congruent evaporation point to InP (about 365 degrees C.). From a practical point of view, a high temperature limitation of 350 degrees C. seems most suitable to ensure that the InP remains undamaged.

A relatively high temperature range, namely 300–350 degrees C., is preferred because of the ease of obtaining single crystal films and the higher rate of deposition which can be achieved with resulting single crystal films. Most preferred is a substrate temperature of 350±10 degrees C. Under these conditions, growth rates of approximately 3000 Angstroms per hour have been achieved with single crystal films of excellent quality.

Growth of fluoride is continued until the desired thickness is obtained. Thickness is monitored by a quartz crystal thickness monitor. Once the desired thickness is obtained, the fluoride beam is turned off and the P$_2$ beam turned on. To grow the semiconducting layer on top of the insulating layer, shutters to In and P$_2$ ovens are opened to grow an epitaxial layer of InP. Growth is allowed to continue until the desired thickness is obtained. Further alternate layers may be grown to obtain more layers of semiconductor and dielectric.

A typical procedure for growing the dielectric film and semiconductor film is as follows:

Films of CaF$_2$ were grown on the (001) face of InP. The substrate temperature was about 350±10 degrees C. and the growth rate was approximately 600 Angstroms per hour. RHEED patterns taken of the resulting CaF$_2$ film showed no evidence of polycrystalline rings but showed sharp spot patterns indicative of a single crystal film. Transmission electron microscopy measurements also show that the CaF$_2$ films grown as described above are single crystal.

After 100 Angstroms of CaF$_2$ are deposited, the fluoride source is closed off and the P$_2$ beam turned on. The shutters to the In oven and P$_2$ oven are turned on to grow the epitaxial layer of InP.

Although the optimal growth condition for InP was not established for our MBE system, the growth proceeded in a phosphorus-rich condition (at substrate temperature of ~500 degrees C.) as indicated by the RHEED patterns. The resulting InP layer is specular in appearance and shows no visible defects. Using Nomarski interference-contrast microscopy, we find that the surface morphology shows some texture, indicative of a lower-than-optimal growth temperature. Photoluminescence is found to be uniform across the wafer, although at a relatively low intensity when compared with the best of conventionally grown (CVD) InP epitaxial layers. The unintentional doping of the epitaxial InP layer is n-type, at $\sim 10^{17}$ cm$^{-3}$.

The process was also applied to the deposition of a mixture of fluorides topped by a layer of semiconductor. Particularly interesting is the mixture of BaF$_2$ and SrF$_2$ since such a mixture can be lattice matched to InP. Experiments were carried out on the (001) face of InP at a substrate temperature of about 350 degrees C. A solid solution of fluorides (Ba$_{0.2}$Sr$_{0.8}$F$_2$) was contained in an oven as shown in FIG. 1. The films of mixed fluoride obtained in this way were single crystal and showed no evidence of twinning.

The InP was then deposited much as described above. This resulted in an InP/Ba$_x$Sr$_{1-x}$F$_2$/InP(001) structure with a lattice mismatch of about +2 percent. Further adjustments in the composition of the BaF$_2$—SrF$_2$ solid solution would lead to closer lattice matching between semiconductor and insulator.

Experiments can also be carried out with separate sources of BaF$_2$ and SrF$_2$. Here, some variations in composition and lattice parameter across the film composition substrate might occur. This variation may be removed in two ways. First, the substrate may be rotated so as to ensure uniform composition of the entire surface. Because of the low rate of deposition, the rate of rotation may be quite slow, perhaps as slow as one revolution per minute. Higher rates of rotation may also be used (e.g., 60 revolutions per minute).

Another procedure for ensuring uniform deposition over the entire surface of the substrate is to use a single source in the form of a solid solution of BaSrF$_2$. The source may be prepared in a variety of ways well known in the art provided such preparation procedure yields crystals of high purity. In particular, exclusion of water and oxygen is of particular importance. A typical preparation is to zone-refine in a dry HF atmosphere the separately zone-refined BaF$_2$ and SrF$_2$ crystals. This procedure ensures the highest purity fluoride crystals.

Initial experiments were carried out using a fluoride composition which lattice matched InP. However, initial experiments showed that the source evaporated noncongruently at the operating source temperature (about 1200 degrees C.) so that the resulting film was rich in BaF$_2$. The noncongruent evaporation was confirmed by measuring the composition of source material after the MBE experiments. These measurements were carried out by X-ray fluorescence spectroscopy and showed that the source material was deficient in BaF$_2$. Adjustments of the composition of Ba$_x$Sr$_{1-x}$F$_2$ yield lattice matched single crystal films. Transmission electron microscopy measurements showed that the films of Ba$_x$Sr$_{1-x}$F$_2$ are indeed single crystal. For GaAs, the growth temperature range is from 300 to 650 degrees C. and lattice matching achieved in the CaF$_2$—SrF$_2$ mixed fluoride system.

Typical thicknesses for the insulating layer are from 50–5000 Angstrom units with from 50–200 preferred. After the desired thickness is obtained, the fluoride beam is turned off and the P$_2$ turned on. The semiconductor layer is then deposited as described above. The substrate temperature should be between 300 and 650 degrees C. with about 500±50 degrees C. preferred.

The resulting InP layer is specular in appearance and shows no visible defects. Photoluminescence is found to be uniform across the wafer, although at a relatively low intensity when compared with the best of conventionally grown (CVD) InP epitaxial layers. The unintentional doping of the epitaxial layer is n-type at about $10^{17}$ cm$^{-3}$. Similar results may be obtained with gallium arsenide layers.

Figure 2:
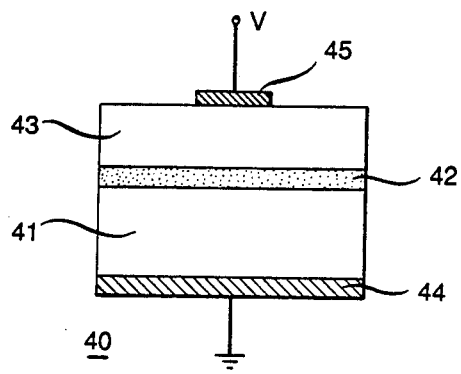
FIG. 2 shows a semiconductor-dielectric-semiconductor structure with attached electrodes.

FIG. 2 shows a device structure 40 consisting of InP substrate 41, CaF$_2$ insulating epitaxial layer 42 and InP epitaxial layer 43. A ground electrode 44 and another electrode 45 are also shown. This is essentially the basic unit of devices made in accordance with the invention.

Figure 3:
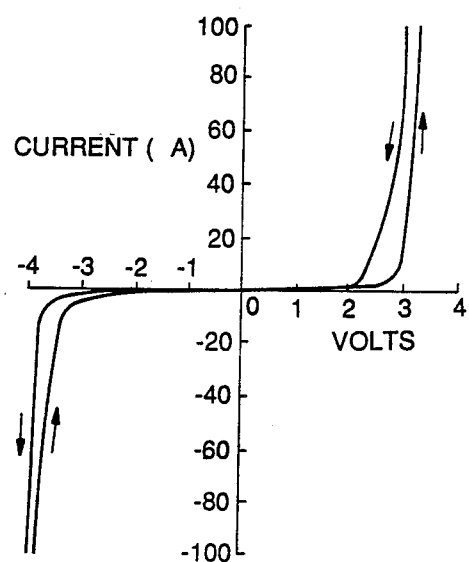
FIG. 3 shows a graph of a current-voltage characteristic of the structure shown in FIG. 2.

FIG. 3 shows a graph of the current-voltage characteristics of the structure shown in FIG. 2. The thickness of the insulating layer (CaF$_2$) was 100 Angstroms.

The I-V characteristics can be separated into two distinct regions. At low applied voltage (voltage less than 2 volts) the dependence of I on V is linear and non-hysteretic. From this ohmic region, the resistivity is estimated as $\rho \simeq 2 \times 10^{10}$ ohm-cm for the CaF$_2$ film. This value is somewhat low compared with thicker CaF$_2$, which has a resistivity of typically $\rho \simeq 10^{13}$ ohm-cm. Although not fully understood at present, this discrepancy may be due to leakage through defects in the film.

At the high voltage region (voltage greater than 2.5 volts), we observe a nondestructive, nearly exponential increase of current with voltage, characteristic of carrier tunneling through the insulating film. Note however that there is considerable reproducible hysteresis in these characteristics, where the current is lower as the voltage is increased than when the voltage is decreased. This hysteresis is detected for both quasistatic and 60 Hz cycling of the voltage, and is evidence for slow traps at the CaF$_2$/InP interface, or alternatively within the CaF$_2$ itself.

The I-V characteristics analyzed in the tunneling regime can be used to determine the CaF$_2$/InP barrier height, a parameter useful for device design applications. For CaF$_2$ thickness of 100 Angstroms, a barrier height of $\phi = (1.2 \pm 0.2)$V is obtained. However, this appears unusually small for a semiconductor/insulator barrier, indicating a trap-assisted tunneling mechanism.

Finally, capacitance-voltage measurements of the device were made at 1 MHz, and they indicate that the capacitance is nearly independent of voltage, as expected from a semiconductor-insulator-semiconductor structure consisting of highly doped semiconductor layers.

Other device structures were also grown. One example as described above was an InP/Ba$_x$Sr$_{1-x}$F$_2$/InP(001) structure. This structure also exhibited many traps of the semiconductor-insulator interface as evidenced by significant hysteresis in the I-V characteristics. Better lattice matching should decrease the defect density.

What is claimed is:

1. A process for fabricating a semiconductor device, said semiconductor device comprising semiconductor substrate and on top of said semiconductor substrate, alternating layers of insulating layer and semiconductor layer in which
   1. The semiconductor substrate comprises at least one Group III-V semiconductor compound;
   2. The insulating layer comprises epitaxial insulating film of cubic Group II fluoride which is substantially twin-free and substantially single crystal, and the cubic Group II fluoride is selected from the group consisting of Ca$_x$Sr$_{1-x}$F$_2$ and Ba$_y$Sr$_{1-y}$F$_2$ where x and y vary from 0 to 1; and
   3. The semiconductor layer comprises an epitaxial semiconductor film of at least one Group III-V semiconductor compound, said semiconductor film being substantially twin-free and substantially single crystal said process comprising the steps of:
   (a) introducing the semiconductor substrate into a vacuum chamber and reducing the background pressure to a subatmosphere pressure,
   (b) exposing the semiconductor substrate surface to a molecular beam cleaning procedure,
   (c) directing at least one molecular beam of the cubic Group II fluoride upon the semiconductor surface at a certain rate while maintaining the semiconductor surface at a certain growth temperature range so as to form an epitaxial insulating layer,
   (d) directing molecular beams comprising the elements of a III-V compound semiconductor onto the surface of the insulating layer; characterized in that
   (e) the molecular beam cleaning procedure is carried out in the temperature range from 400 to 700 degrees C. and a molecular beam of the Group V element is maintained on the surface of the semiconductor material so as to maintain the stoichiometry of the surface while removing any impurity layers on the semiconductor material surface, and
   (f) the growth temperature range is the temperature range 150 degrees C. below the decomposition temperature of the III-V semiconductor and the growth rate is at least 250 Angstroms per hour so as to grow a substantially single crystal, twin-free layer of cubic Group II fluoride on part of the surface of the III-V semiconductor and in which immediately before step (a), molecular beam cleaning procedure is carried out with a semiconductor surface temperature of approximately 600±50 degrees C. under an arsenic molecular beam.

2. The process of claim 1 in which immediately before step (a), the Group III-V semiconductor surface is cleaned by polishing said surface with a chemical polishing solution.

3. The process of claim 2 in which the chemical polishing solution is bromine dissolved in methanol.

4. The process of claim 1 in which the Group III-V semiconductor is InP or a Group III-V semiconductor lattice matched to InP.

5. The process of claim 4 in which the Group III-V semiconductor is InP.

6. The process of claim 4 in which the molecular beam cleaning procedure is carried out with a semiconductor surface temperature of approximately 500±50 degrees C. under a phosphorus molecular beam.

7. The process of claim 6 in which the phosphorus beam originates from InP.

8. The process of claim 6 in which the pressure is between $10^{-5}$ and $10^{-6}$ Torr.

9. The process of claim 4 in which the growth temperature range is between 250 and 350 degrees C.

10. The process of claim 9 in which the growth temperature is between 300 and 350 degrees C.

11. The process of claim 4 in which the cubic Group II fluoride is calcium fluoride and the growth temperature is 350±10 degrees C. and the growth rate is approximately 600 Angstroms per hour.

12. The process of claim 1 in which the cubic Group II fluoride is Ba$_x$Sr$_{1-x}$F$_2$ and x is adjusted so that the Ba$_x$Sr$_{1-x}$F$_2$ is lattice matched to InP.

13. The process of claim 12 in which the semiconductor is rotated to remove variations in composition and lattice parameters.

14. The process of claim 1 in which the Group III-V semiconductor is GaAs or a Group III-V semiconductor lattice matched to GaAs.

15. The process of claim 14 in which the Group III-V semiconductor is n-type GaAs.

16. The process of claim 14 in which the arsenic beam originates from the element arsenic.

17. The process of claim 14 in which the pressure is between $10^{-5}$ and $10^{-6}$ Torr.

18. The process of claim 14 in which the growth temperature range is between 300 and 650 degrees C.

19. The process of claim 14 in which the cubic Group II fluoride is $Ca_xSr_{1-x}F_2$ and x is adjusted so that the $Ca_xSr_{1-x}F_2$ is lattice matched to GaAs.

* * * * *

UNITED STATES PATENT AND TRADEMARK OFFICE
CERTIFICATE OF CORRECTION

PATENT NO. : 4,935,382

DATED : June 19, 1990

INVENTOR(S) : Wilbur D. Johnston, Jr., and Charles W. Tu

It is certified that error appears in the above-identified patent and that said Letters Patent is hereby corrected as shown below:

Column 2, line 53 "7.996" should read --5.7996--
Column 3, line 1 after "films." insert --In addition $Ba_xSr_{1-x}F_2$ yields substantially twin-free single crystalline films.--
Column 3, line 48 after "used" insert --to procure the various layers in the multilayer--
Column 5, line 17 "to" should read --of--
Column 5, line 46 "film" should read --films--
Column 6, line 4 "$SiF_2$" should read --$SrF_2$--
Column 6, line 14 "adjustments" should read --adjustment--

Signed and Sealed this

Seventeenth Day of December, 1991

Attest:

HARRY F. MANBECK, JR.

*Attesting Officer*  *Commissioner of Patents and Trademarks*